United States Patent
Kao et al.

(10) Patent No.: US 7,247,267 B2
(45) Date of Patent: Jul. 24, 2007

(54) MOLD AND METHOD OF MOLDING SEMICONDUCTOR DEVICES

(75) Inventors: Jen-Chieh Kao, Kaohsiung (TW); Kuo-Chung Yee, Taipei (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 349 days.

(21) Appl. No.: 10/710,906

(22) Filed: Aug. 12, 2004

(65) Prior Publication Data

US 2005/0037104 A1    Feb. 17, 2005

(30) Foreign Application Priority Data

Aug. 12, 2003  (TW)  ................ 92122061 A

(51) Int. Cl.
B29C 70/72   (2006.01)
H01L 21/56   (2006.01)

(52) U.S. Cl. ............... 264/272.17; 425/116; 425/121; 425/129.1; 438/112; 438/127

(58) Field of Classification Search ............. 425/116, 425/117, 121, 123, 127, 129.1, 544, 572, 425/588; 264/272.17; 438/112, 127
See application file for complete search history.

(56) References Cited

U.S. PATENT DOCUMENTS

| | | | | |
|---|---|---|---|---|
| 4,862,246 A | * | 8/1989 | Masuda et al. | ............ 257/666 |
| 5,114,880 A | * | 5/1992 | Lin | ............ 438/107 |
| 5,401,155 A | * | 3/1995 | Shikagawa et al. | ......... 425/127 |
| 5,484,274 A | * | 1/1996 | Neu | ............ 425/116 |
| 6,081,978 A | * | 7/2000 | Utsumi et al. | ............ 29/25.01 |
| 6,355,199 B1 | * | 3/2002 | Briar et al. | ............ 264/272.17 |
| 6,969,918 B1 | * | 11/2005 | James et al. | ................ 257/787 |

FOREIGN PATENT DOCUMENTS

| | | | |
|---|---|---|---|
| JP | 56049208 A | * | 5/1981 |
| JP | 02143816 A | * | 6/1990 |
| JP | 03250635 A | * | 11/1991 |

* cited by examiner

*Primary Examiner*—Robert B. Davis
(74) *Attorney, Agent, or Firm*—Jianq Chyun IP Office

(57) ABSTRACT

A mold for molding semiconductor devices mounted on a package substrate is provided. The mold comprises a top mold and a bottom mold. The top mold has a top runner, at least a first dummy runner and a plurality of mold cavities. The first dummy runner connects with the top runner and the top runner extends into a space between the mold cavities. The mold cavities for accommodating the semiconductor devices are connected to the top runner. The bottom mold has a bottom runner and at least a second dummy runner. The second dummy runner connects with the bottom runner. The second dummy runner is above but separated from the first dummy runner by the package substrate.

17 Claims, 13 Drawing Sheets

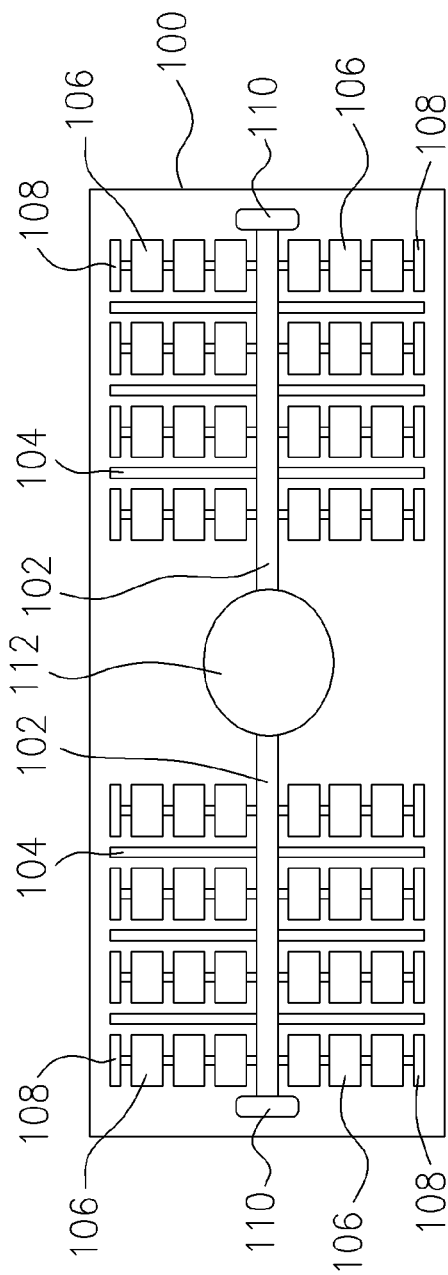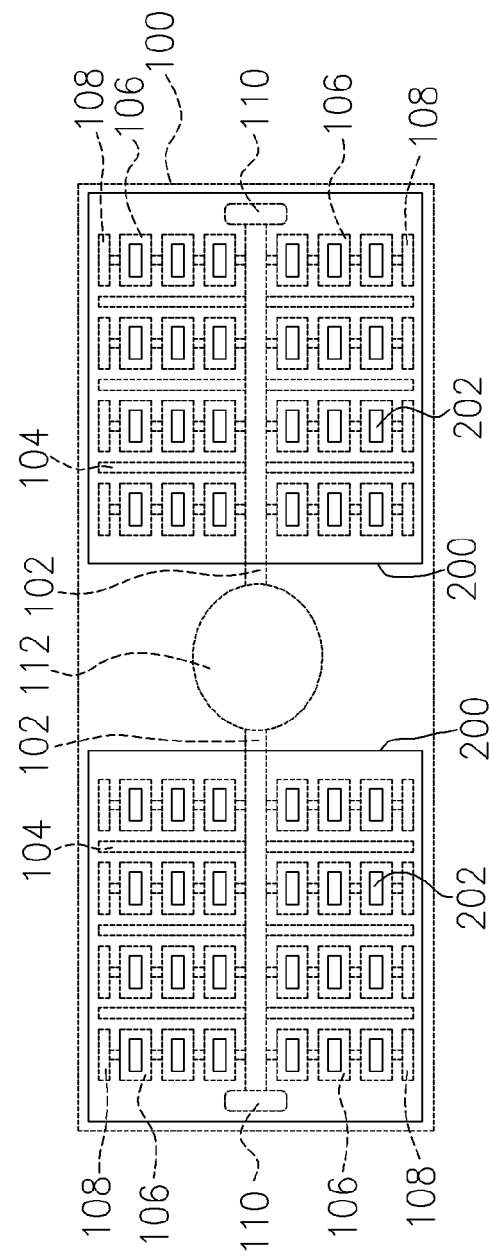

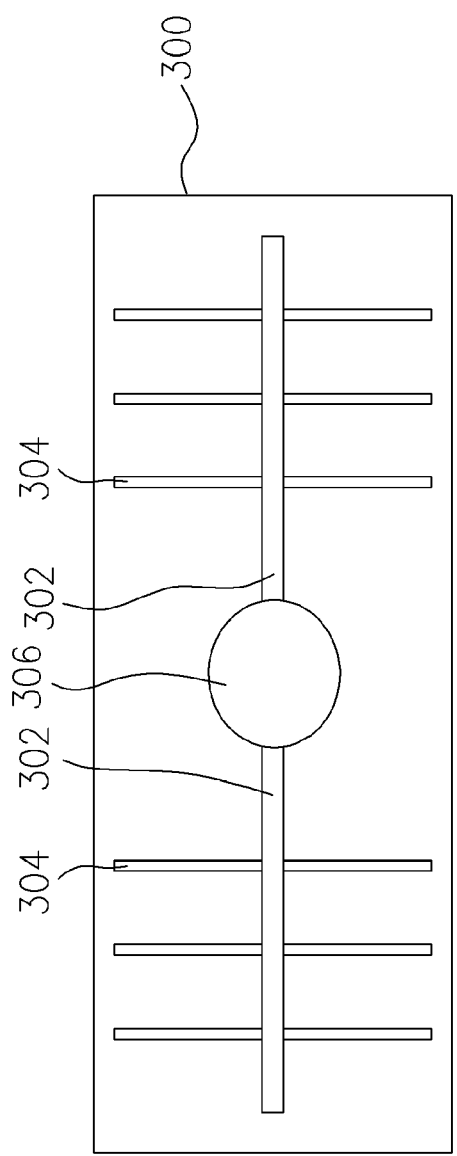
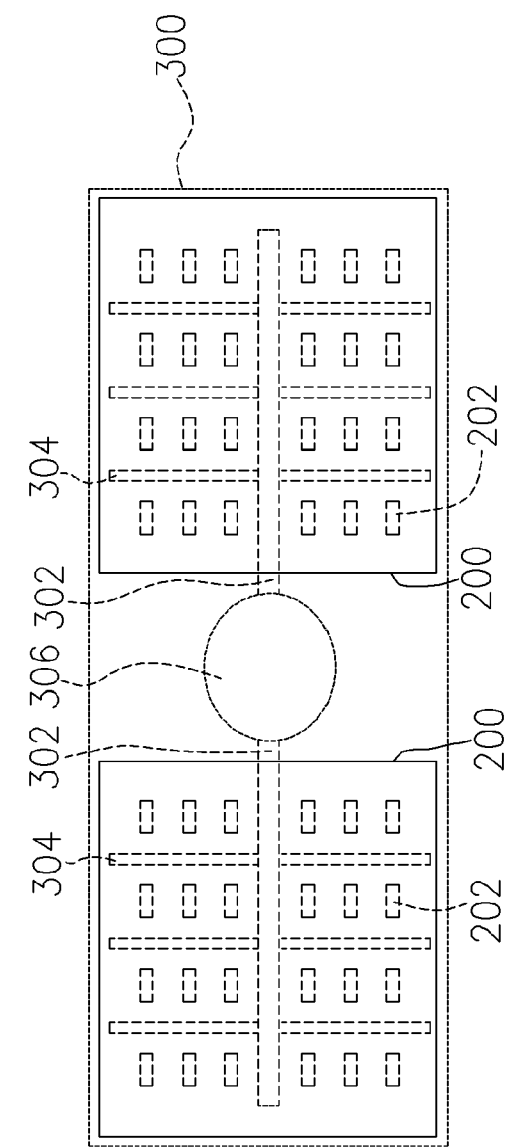
FIG. 2A
FIG. 2B

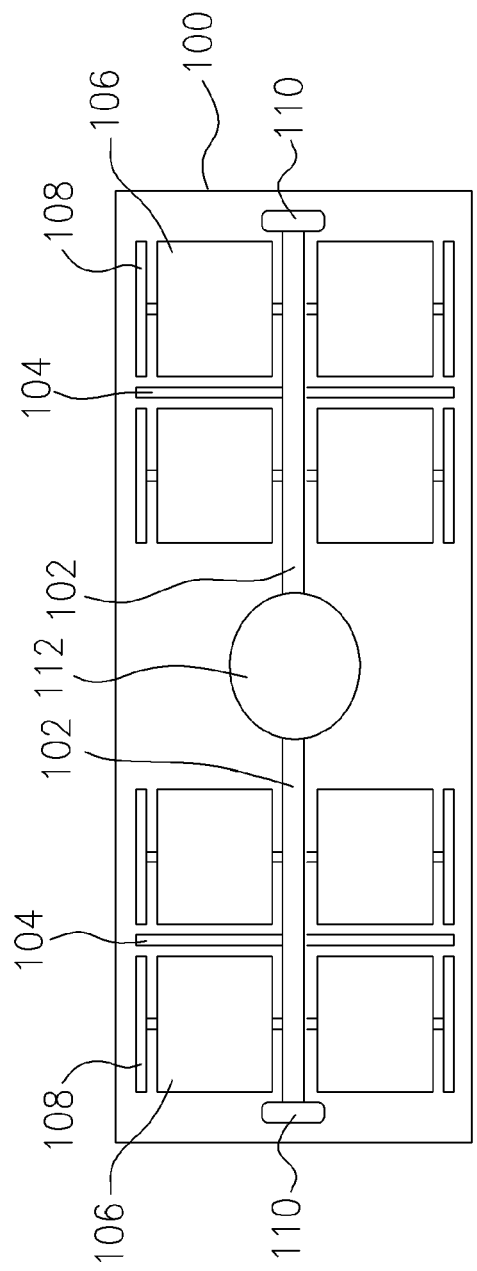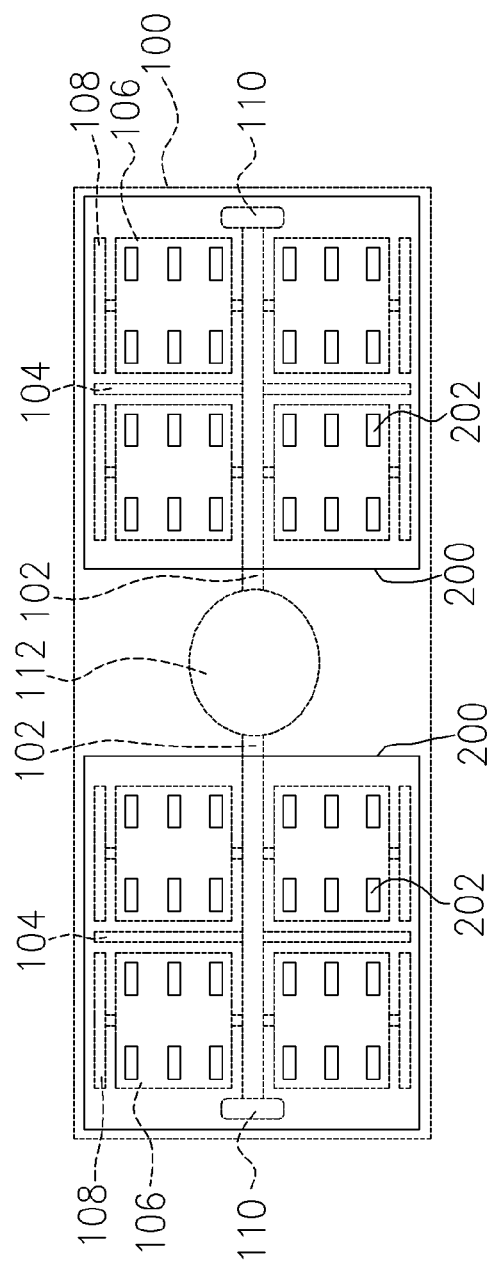

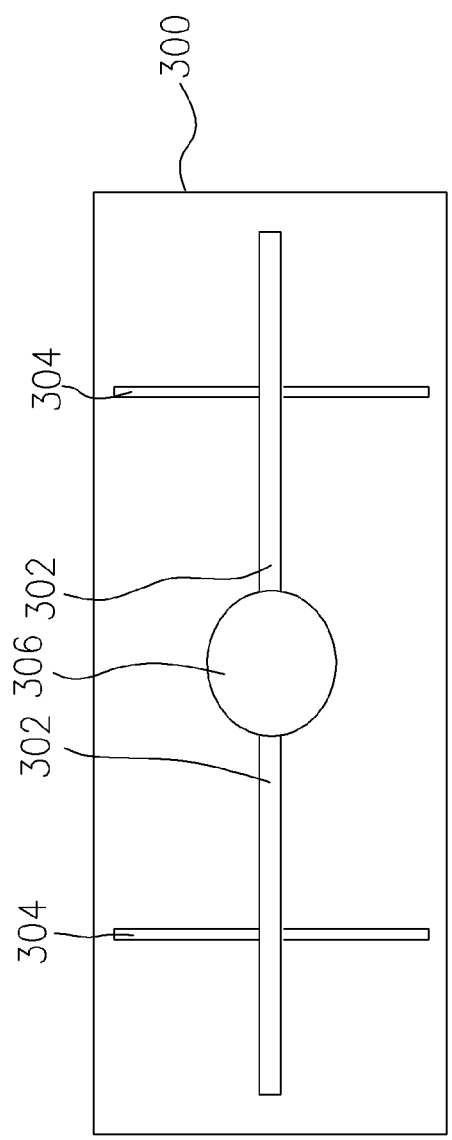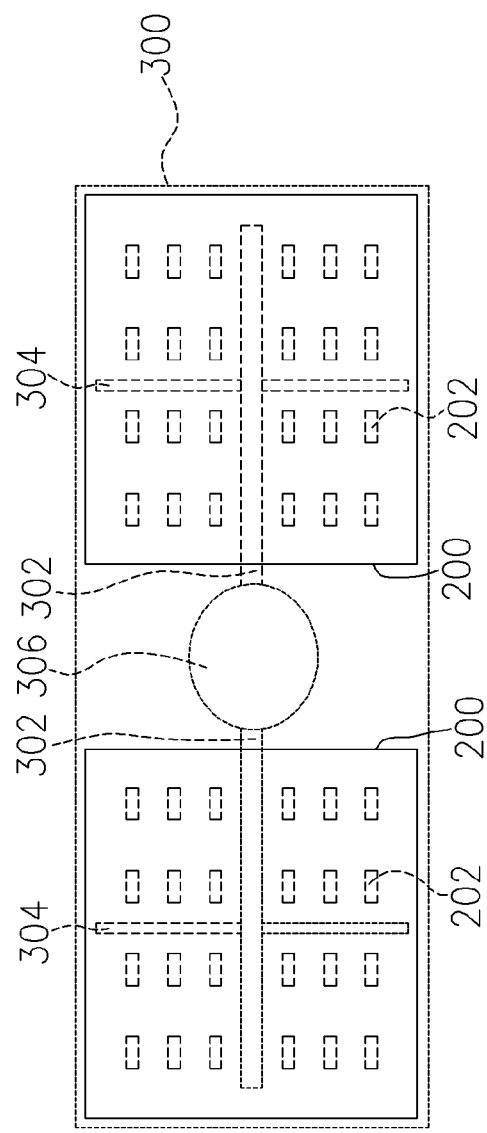

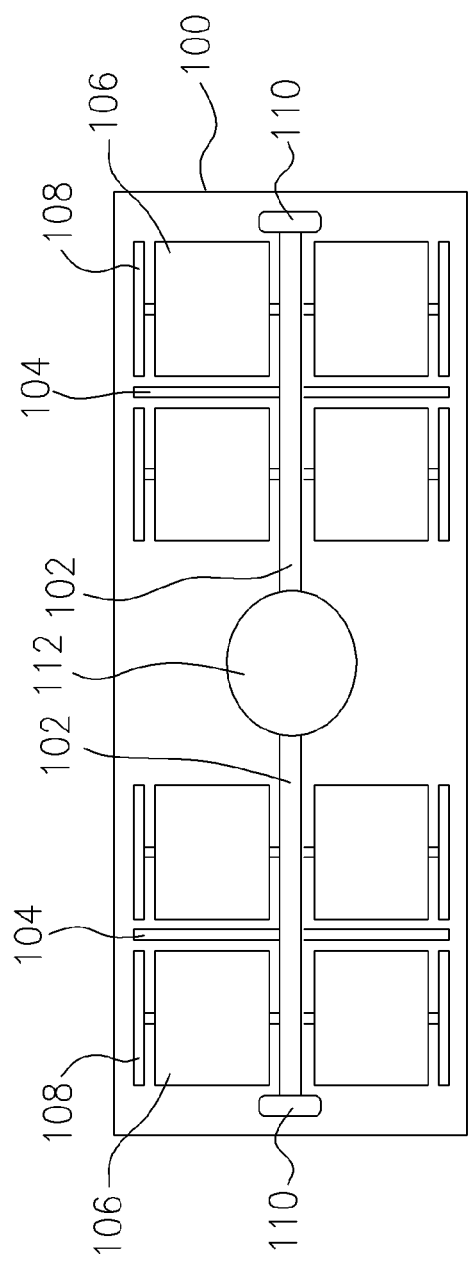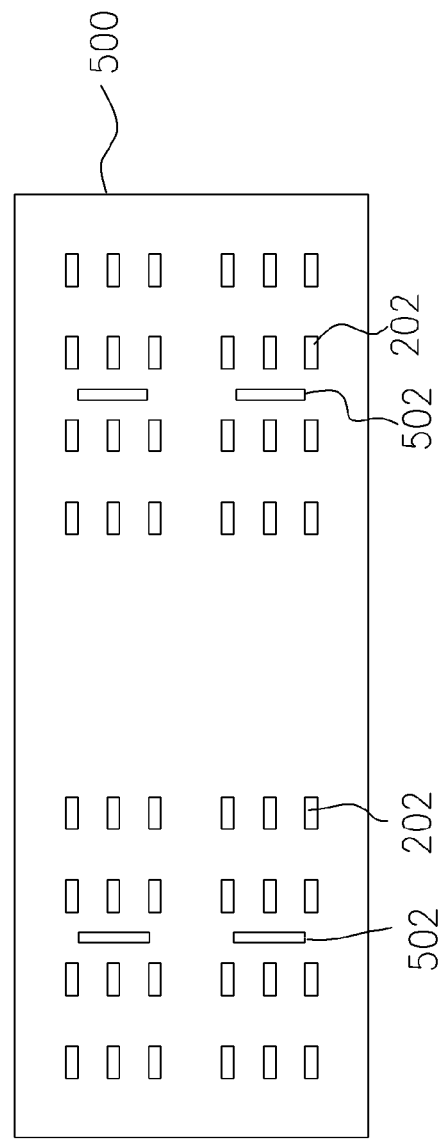

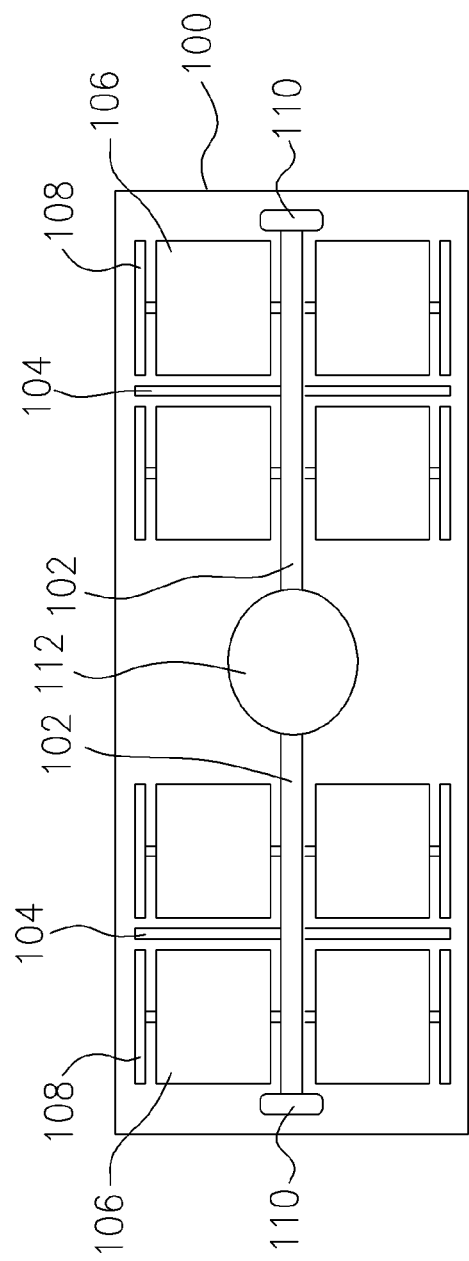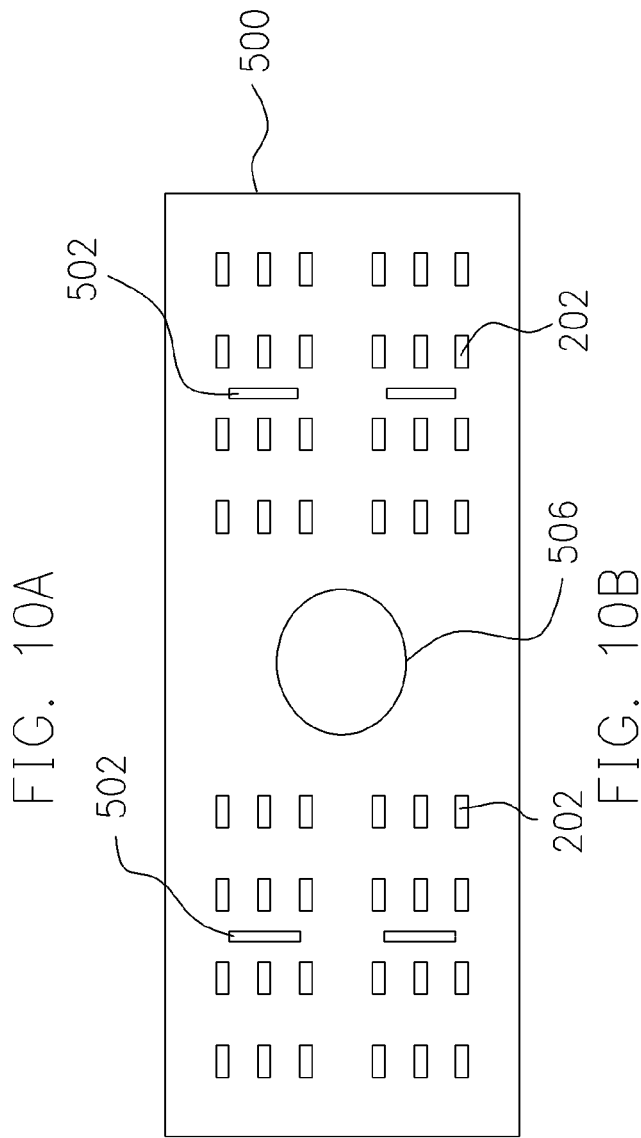

MOLD AND METHOD OF MOLDING SEMICONDUCTOR DEVICES

CROSS REFERENCE TO RELATED APPLICATIONS

This application claims the priority benefit of Taiwan application serial no. 92122061, filed Aug. 12, 2003.

BACKGROUND OF INVENTION

1. Field of the Invention

The present invention relates to a mold and a method of molding semiconductor devices. More particularly, the present invention relates to a mold and a method of molding semiconductor devices capable of preventing a package from warping.

2. Description of the Related Art

Due to the rapid development of multi-media systems, equipment for producing digital images and processing digital images is in great demand. Many types of digital imaging products, for example, PC digital video cameras, digital cameras, optical scanners and imaging phones, are now out in the market. In all these digital products, images are captured through an image sensor. The most common types of image sensors include the charge-coupled device (CCD) and the complementary metal-oxide-semiconductor (CMOS) image sensor. Both types of sensors are sensitive to incident light from an object and can convert the light into a digital signal. Because all these optical devices need to receive the light from the object, the packaging method must differ from most other electronic products.

Conventionally, most optical devices are packaged using ceramic carriers, for example, the ceramic leadless chip carrier (CLCC). Because ceramics has a high thermal dissipation capacity and is resistant to moisture penetration, ceramic packages have high product reliability and are generally used in military or industrial grade products. With the rapid expansion of the electronic industry, more and more optical devices are incorporated into commercial and consumer products. However, if ceramic packages are used in consumer products, cost is a major concern. Since the concern for reliability in commercial or a consumer applications is not so strict, plastic packages are acceptable. In the conventional technique, a common plastic substrate is used in packaging the optical device. Furthermore, to prevent the plastic from affecting the optical characteristics of the package, a transparent packaging material is often used in the packaging process. Yet, the process of injecting the molding material into a mold and waiting the material to cool down often results in a warping of the plastic substrate or the molding compound. In other words, the characteristics of the optical device package may change after the molding process.

Due to market pressure and the need to lower production cost, providing a method capable of lowering the packaging cost of optical sensor while maintaining a moderately high product quality and reliability is an important issue.

SUMMARY OF INVENTION

Accordingly, the present invention is to provide a mold comprising a top mold and a bottom mold for molding semiconductor devices that can prevent the warping of molding compound after cooling through specially designed top and bottom dummy runners.

The present invention is to provide a method of molding semiconductor devices that can prevent the warping of molding compound after cooling through specially designed vertical and horizontal ribs on a packaging substrate.

As embodied and broadly described herein, the invention provides a mold for molding semiconductor devices mounted on a packaging substrate. The mold for molding semiconductor devices mainly comprises a top mold and a bottom mold. The top mold has a top runner, at least a first dummy runner and a plurality of mold cavities. The first dummy runner connects with the top runner and the top runner extends into a space between the mold cavities. The mold cavities for accommodating the semiconductor devices are connected to the top runner. The bottom mold has a bottom runner and at least a second dummy runner. The second dummy runner connects with the bottom runner. The top dummy runner is above but separated from the bottom runner by the package substrate. The first dummy runner is above but separated from the second dummy runner by the package substrate. Furthermore, the first dummy runner extends in a direction perpendicular to the top runner. Similarly, the second dummy runner extends in a direction perpendicular to the bottom runner.

In one embodiment of the present invention, all the mold cavities have an identical dimension and are formed in the top mold as an array. Furthermore, each mold cavity has a volume capable of accommodating one or more than one semiconductor devices.

In one embodiment of the present invention, the top mold has a plurality of first dummy cavities connecting with various mold cavities. Furthermore, the top mold has a plurality of second dummy cavities connecting with the top runner.

In one embodiment of the present invention, the mold further comprises a pot connecting the top runner in the top mold and the bottom runner in the bottom mold. The pot is a cavity made, for example, from the juxtaposition of a first cavity in the top mold and a second cavity in the bottom mold.

The present invention further provides a method of molding semiconductor devices. First, a packaging substrate is provided. The packaging substrate has a first surface and a second surface. Furthermore, the first surface of the packaging substrate has the semiconductor devices disposed thereon. Thereafter, the package substrate is placed inside a mold and then a molding material is injected into the mold so that a plurality of molding compounds are formed on the first surface of the packaging substrate. At the same time, at least a first vertical rib and a first horizontal rib are formed on the first surface of the packaging substrate and at least a second vertical rib and a second horizontal rib are formed on the second surface of the packaging substrate.

In one embodiment of the present invention, before placing the packaging substrate inside the mold, the method further comprises forming at least a first vertical groove and a first horizontal groove on the first surface of the packaging substrate to correspond with the first vertical rib and the first horizontal rib.

In one embodiment of the present invention, before placing the packaging substrate inside the mold, the method further comprises forming at least a second vertical groove and a second horizontal groove on the second surface of the packaging substrate to correspond with the second vertical rib and the second horizontal rib.

In one embodiment of the present invention, the molding material is, for example, a transparent molding material.

In one embodiment of the present invention, the semiconductor devices are encapsulated in one of the molding compounds after the step of injecting a molding material into the mold is performed.

In the present invention, a dummy runner is fabricated on the top and the bottom mold to prevent the warping of molding compound in the process of cooling. Similarly, the fabrication of vertical and horizontal ribs on the packaging substrate is capable of reducing the degree of warping in the molding compound after cooling.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1A is a top view of a top mold of a mold for molding semiconductor devices according to a first embodiment of the present invention.

FIG. 1B is a top view showing the relation between the top mold in FIG. 1A and a packaging substrate.

FIG. 2A is a top view of a bottom mold of the mold for molding semiconductor devices according to the first embodiment of the present invention.

FIG. 2B is a top view showing the relation between the bottom mold in FIG. 2A and a packaging substrate.

FIG. 5A is a top view of a top mold of a mold for molding semiconductor devices according to a second embodiment of the present invention.

FIG. 5B is a top view showing the relation between the top mold in FIG. 5A and a packaging substrate.

FIG. 6A is a top view of a bottom mold of the mold for molding semiconductor devices according to the second embodiment of the present invention.

FIG. 6B is a top view showing the relation between the bottom mold in FIG. 6A and a packaging substrate.

FIGS. 8A through 8C are top views showing the top mold, the packaging substrate and the bottom mold for molding semiconductor devices according to a third embodiment of the present invention.

FIGS. 10A through 10C are top views showing the top mold, the packaging substrate and the bottom mold for molding semiconductor devices according to a fifth embodiment of the present invention.

DETAILED DESCRIPTION

Figure 3:
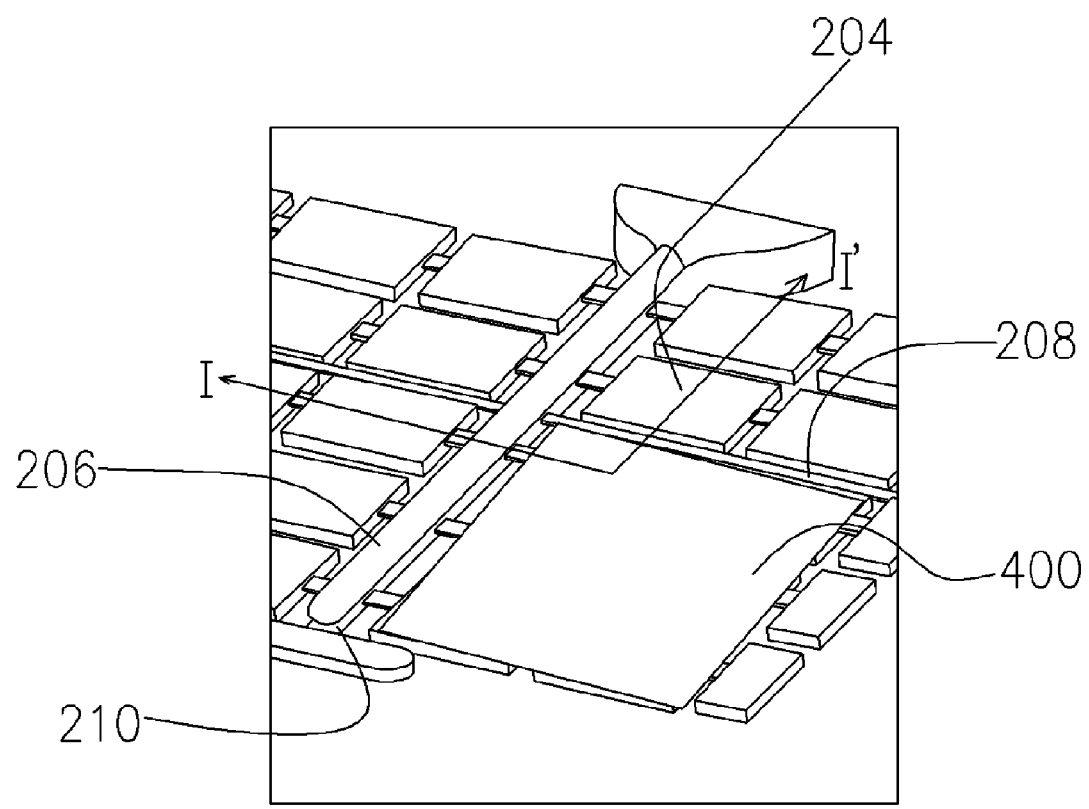
FIG. 3 is a perspective view of the mold according to the first embodiment of the present invention after a molding process.

Reference will now be made in detail to the present embodiments of the invention, examples of which are illustrated in the accompanying drawings. Wherever possible, the same reference numbers are used in the drawings and the description to refer to the same or like parts.

FIG. 1A is a top view of a top mold of a mold for molding semiconductor devices according to a first embodiment of the present invention. FIG. 1B is a top view showing the relation between the top mold in FIG. 1A and a packaging substrate. As shown in FIGS. 1A and 1B, the mold for packaging semiconductor devices mainly comprises a top mold 100 and a bottom mold 300 (shown in FIG. 2A) serving to encapsulate semiconductor devices 202 mounted on a packaging substrate 200. In the present embodiment, the top mold comprises a top runner 102, at least a first dummy runner 104, a plurality of mold cavities 106, a plurality of first dummy cavities 108, a plurality of second dummy cavities 110 and a first cavity 112.

The first dummy runner 104 is connected to the top runner 102. Furthermore, the first dummy runner 104 extends from the top runner 102 into a space between various mold cavities 106. In other words, the first dummy runner 104 extends in a direction perpendicular to the top runner 102. Because the first dummy runner 104 and the top runner 102 extend in different directions, the packaging substrate 200 is prevented from warping after the molding process. The exact details of how the first dummy runner 104 is able to suppress the warping in the packaging substrate are described with reference to FIG. 3.

As shown in FIG. 1A, a plurality of first dummy cavities 108 are also formed in the top mold 100 to prevent the formation of flush after mold injection. The first dummy cavities 108 are connected to the mold cavities 106. Furthermore, the first dummy cavities 108 are located along a flow path of the molding material after the mold cavities 106. In addition, a plurality of second dummy cavities 110 is also formed in the top mold 100. The second dummy cavities 110 are connected to the top runner 102. The purpose of forming the second dummy cavities 110 is to reduce the formation of flush. The functions of the second dummy cavities 110 are similar to those of the first dummy cavities 108.

As shown in FIGS. 1A and 2A, the top mold 100 further comprises a first cavity 112. The first cavity 112 is connected to the top runner 102. The bottom mold 300 also has a second cavity 306. The second cavity 306 is connected to a bottom runner 302 of the bottom mold 300. Furthermore, the second cavity 306 is located under the first cavity 112. It should be noted that the first cavity 112 in the top mold 100 and the second cavity 306 in the bottom mold 300 together form a pot inside the entire mold. The pot connects the top runner 102 in the top mold and the bottom runner 302 in the bottom mold so that molding material can be injected into the top and bottom mold via the pot.

As shown in FIG. 1B, all the mold cavities 106 are connected to the top runner 102. The mold cavities 106 are located on the top mold 100 to correspond with the location of various semiconductor devices 202. Each mold cavity 106 has an identical dimension and capable of accommodating one semiconductor device 202. In other words, when the semiconductor devices 202 mounted on the packaging substrate 200 are arranged in an array, the mold cavities 106 are also similarly located on the top mold 100 as an array.

FIG. 2A is a top view of a bottom mold of the mold for molding semiconductor devices according to the first embodiment of the present invention. FIG. 2B is a top view showing the relation between the bottom mold in FIG. 2A and a packaging substrate. As shown in FIGS. 2A and 2B, the bottom mold 300 has a bottom runner 302 and at least a second dummy runner 304. The second dummy runner 304 is connected to the bottom runner 302.

As shown in FIGS. 1B and 2B, the top runner 102 is above but separated from the bottom runner 302 by the packaging substrate 200. Similarly, the first dummy runner 104 is above but separated from the second dummy runner 304 by the packaging substrate 200. The second dummy runner 304 in the bottom mold 300 extends in a direction perpendicular to the bottom runner 302. Because the second dummy runner 304 and the bottom runner 302 extend in different directions, warping of the packaging substrate 200 after cooling is suppressed.

Figure 4:
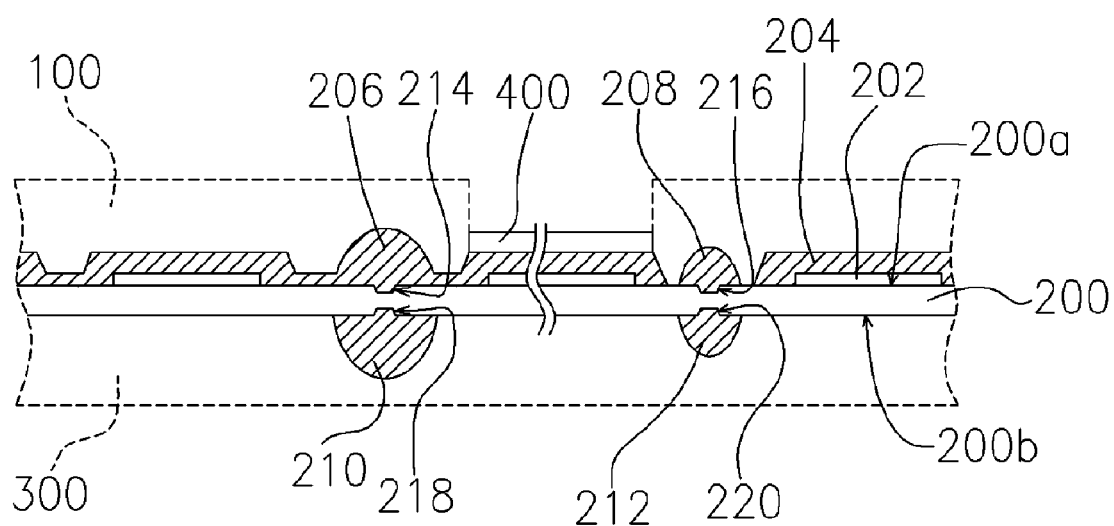
FIG. 4 is a cross-sectional view along line I-I' of FIG. 3.

FIG. 3 is a perspective view of the mold according to the first embodiment of the present invention after a molding process. FIG. 4 is a cross-sectional view along line I-I' of FIG. 3. As shown in FIGS. 3 and 4, the packaging method of the present invention comprises providing a packaging substrate 200 having a first surface 200a and a second surface 200b. A semiconductor device 202 is mounted on the first surface 200a of the packaging substrate 200. The packaging substrate 200 is placed inside a mold comprising a top mold 100 and a bottom mold 300. Thereafter, molding material, such as a transparent molding material, is injected into the cavities between the top mold 100 and the bottom mold 300. Hence, a plurality of molding compounds 204 together with at least a first vertical rib 206 and first horizontal rib 208 are formed on the first surface 200a of the packaging substrate 200. In the meantime, at least a second vertical rib 210 and a second horizontal rib 212 are formed on the second surface 200b of the packaging substrate 200.

it should be noted that the first vertical rib 206 is formed when molding material is injected into the top runner 102 and the first horizontal rib 208 is formed when molding material is injected into the first dummy runner 104. Similarly, the second vertical rib 210 is formed when molding material is injected into the bottom runner 302 and the second horizontal rib 212 is formed when molding material is injected into the second dummy runner 302. Furthermore, one or more first vertical grooves 214 and first horizontal grooves 216 can be formed on the first surface 200a of the packaging substrate 200 to correspond with the first vertical rib 206 and the first horizontal rib 208 prior to placing the packaging substrate 200 inside the mold. With this arrangement, the adhesion of the first vertical rib 206 and the first horizontal rib 208 to the packaging substrate 200 is improved.

Similarly, one or more second vertical grooves 218 and first horizontal grooves 220 can be formed on the second surface 200b of the packaging substrate 200 to correspond with the second vertical rib 210 and the first horizontal rib 212 prior to placing the packaging substrate 200 inside the mold. Thus, the adhesion of the second vertical rib 210 and the second horizontal rib 212 to the packaging substrate 200 is improved.

As shown in FIGS. 3 and 4, the present embodiment can be applied to package other types of substrates as well. Although the packaging of an optical device is used in the illustration, the scope of the present invention is by no means limited as such.

To provide suitable optical characteristics after packaging the optical device, the surface of the molding compound 204 is typically a mirror surface. However, polishing the sidewalls of each cavity to form mirror surfaces is too costly. Therefore, mirror pins 400 are frequently deployed on the top mold 100 so that the specified surfaces of the molding compound 204 are mirror surfaces.

The degree of warping of the packaging substrate 200 can be reduced considerably after the mold according to the present invention is deployed to package semiconductor devices. Since the distribution of mold cavities 106 in the top mold 100 is identical to the arrangement of the semiconductor devices 202 on the packaging substrate 200, the quantity of mirror pins 400 demanded is identical to the number of semiconductor devices 202 to be packaged. Because mirror pins 400 are expensive to produce, lowering the production cost of mirror pins 400 is an important issue. A method of lowering the production cost of mirror pins 400 is provided in the second embodiment of the present invention.

FIG. 5A is a top view of a top mold of a mold for molding semiconductor devices according to a second embodiment of the present invention. FIG. 5B is a top view showing the relation between the top mold in FIG. 5A and a packaging substrate. As shown in FIGS. 5A and 5B, the present invention has a top mold similar to the top mold 100 in the first embodiment except for the relation between the mold cavities 106 and the semiconductor devices 202. In the second embodiment, the mold cavities 106 has a dimension capable of accommodating one or a plurality of semiconductor devices 202 so that the number of mold cavities inside the mold is decreased. Another difference lies in the number and distribution of the first dummy runners 104.

FIG. 6A is a top view of a bottom mold of the mold for molding semiconductor devices according to the second embodiment of the present invention. FIG. 6B is a top view showing the relation between the bottom mold in FIG. 6A and a packaging substrate. As shown in FIGS. 6A and 6B, the bottom mold 300 is similar to the bottom mold in the first embodiment (shown in FIG. 2A) except for the number and distribution of the second dummy runners 304.

Figure 7:
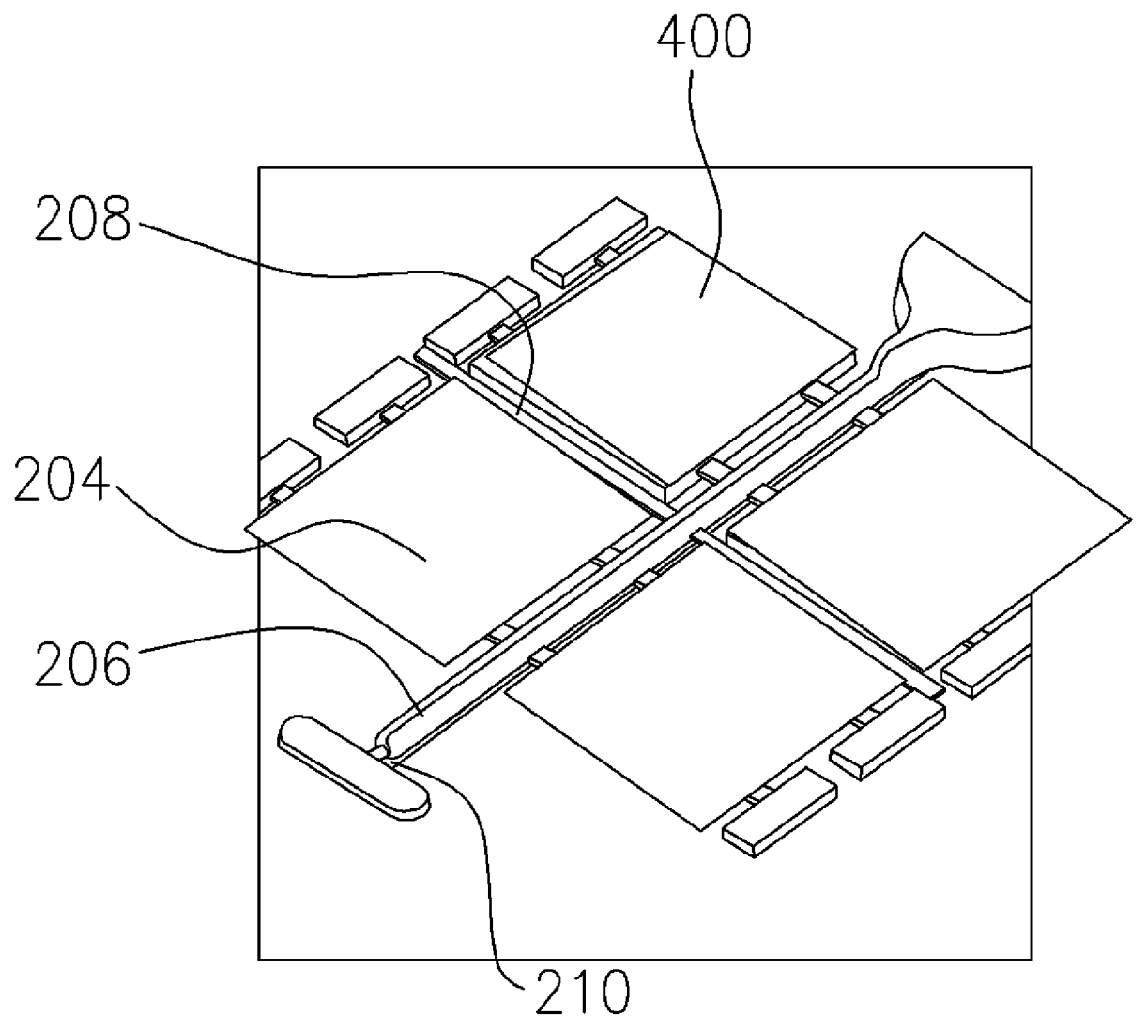
FIG. 7 is a perspective view of the mold according to the second embodiment of the present invention after a molding process.

FIG. 7 is a perspective view of the mold according to the second embodiment of the present invention after a molding process. As shown in FIG. 7, the total number of mirror pins 400 inside the mold is smaller compared with the one shown in FIG. 3 because a plurality of semiconductor devices 202 uses a common mirror pine 400 during the encapsulating process. This reduces the production cost of the mirror pins 400 considerably. However, with a reduction in the number of first dummy runners 104 and second dummy runners 304, the degree of warping in the molding compounds may deteriorate. Therefore, the total number of mirror pins 400 deployed inside the mold and the number of first dummy runners 104 and the second dummy runners 304 formed in the top and bottom mold have to be optimized for package reliability and production cost.

Figure 8C:
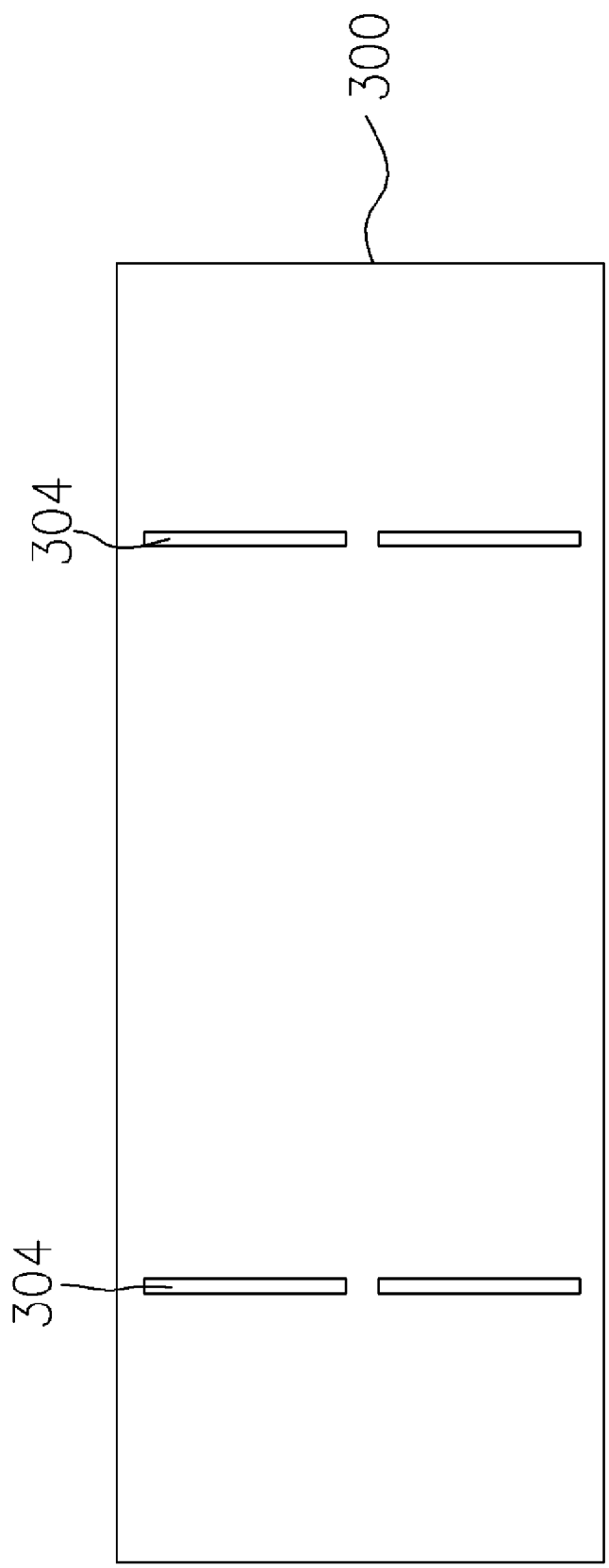

FIGS. 8A through 8C are top views showing the top mold, the packaging substrate and the bottom mold for molding semiconductor devices according to a third embodiment of the present invention. As shown in FIGS. 8A through 8C, the top mold 100 of in the present embodiment has a design sign almost identical to the top mold in the second embodiment. However, the bottom mold 300 (shown in FIG. 8C) and the packaging substrate 500 (shown in FIG. 8B) are different.

In the third embodiment, the bottom mold 300 only has second dummy runners 304. The bottom runner 302 and the second cavity 306 are omitted from the design because openings 502 are formed in the packaging substrate 500 on locations that correspond to the first dummy runners 104 and the second dummy runners 304. These openings 502 connect the first dummy runners 104 in the top mold 100 with the bottom dummy runners 304 in the bottom mold 300. Hence, molding material is able to flow into the second dummy runners 304 via the first cavity 112, the top runner 102, the first dummy runners 104 and the openings 504.

Furthermore, the first dummy runners 104 in the top mold 100 can be omitted as well. However, to facilitate the movement of molding material through the openings 502 into the second dummy runners 304, the openings 502 can be partially or entirely positioned underneath the mold cavities 106. Thus, the molding material injected into the mold cavities 106 can easily flow into the second dummy runners 304.

Figure 9A:
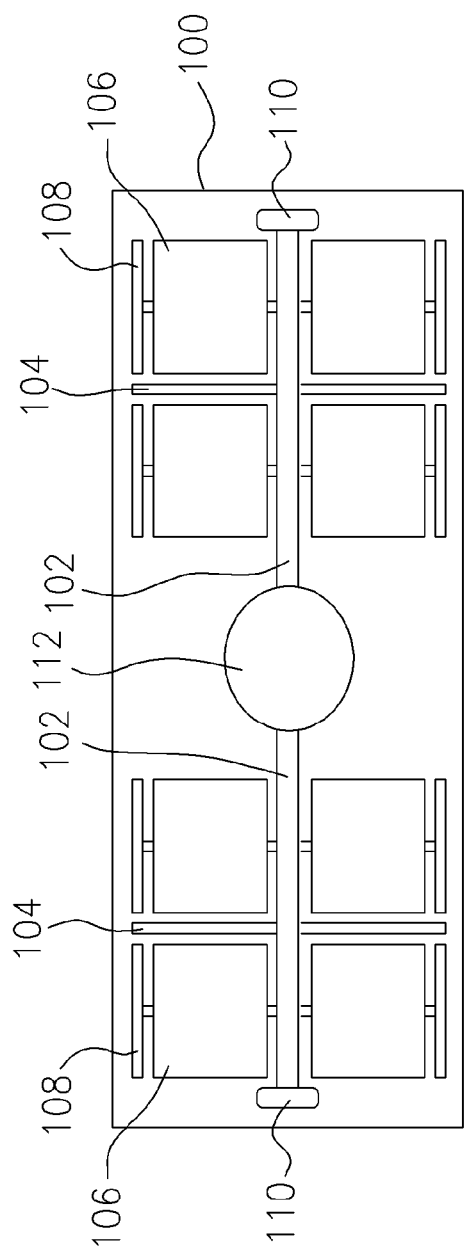
FIGS. 9A through 9C are top views showing the top mold, the packaging substrate and the bottom mold for molding semiconductor devices according to a fourth embodiment of the present invention.
Figure 9B:
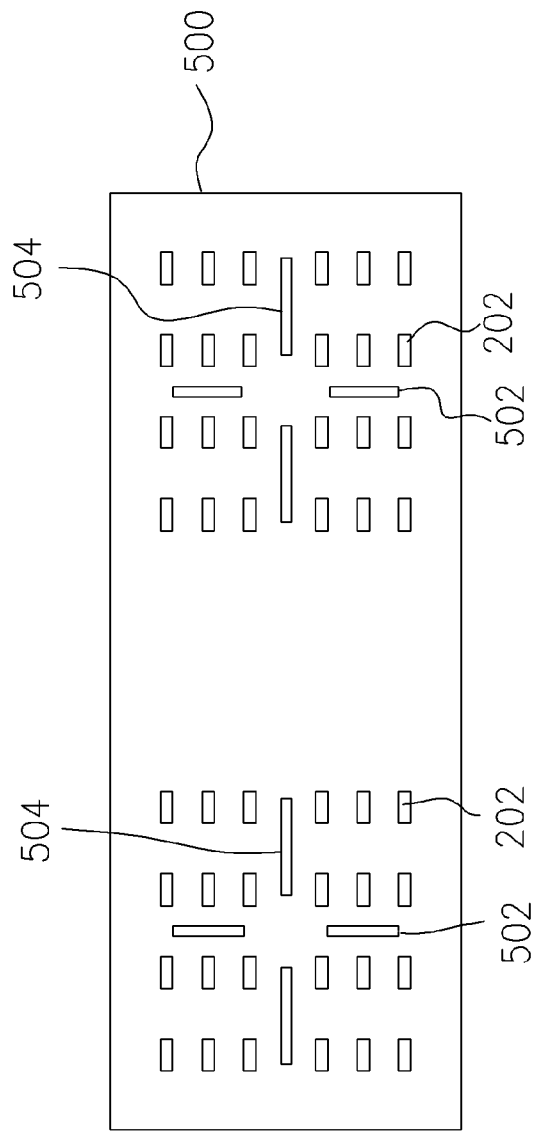
Figure 9C:
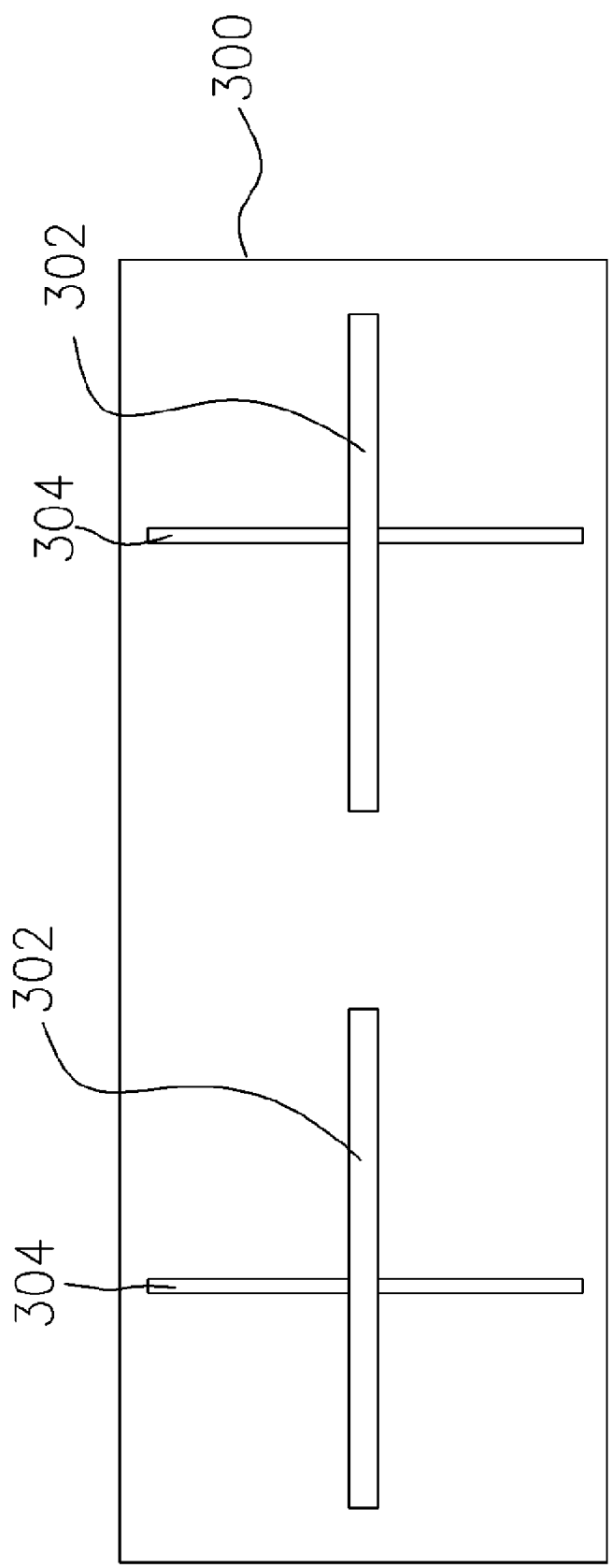

FIGS. 9A through 9C are top views showing the top mold, the packaging substrate and the bottom mold for molding semiconductor devices according to a fourth embodiment of the present invention. As shown in FIGS. 9A through 9c, the bottom mold 300 in the present embodiment is identical to the one in the third embodiment except for the additional second runner 302 that connects to the second dummy runners 304. Furthermore, the packaging substrate 500 has additional openings 504 beside the openings 502. The openings 502 are located to connect a first dummy runner 104 with a corresponding second dummy runner 304 while the openings 504 are located to connect a top runner 102 with a bottom runner 302.

In the molding process, molding material flows into the bottom runner 302 through the first cavity 112, the top runner 102 and the openings 504. The molding material passing through the top runner 102 and the bottom runner 302 can also pass through the openings 502 into the first dummy runners 104 and the second dummy runners 304. It should be noted that the openings 502 permits molding materials to pass from the first dummy runner 104 into the second dummy runner 304 or vice versa.

Figure 10C:
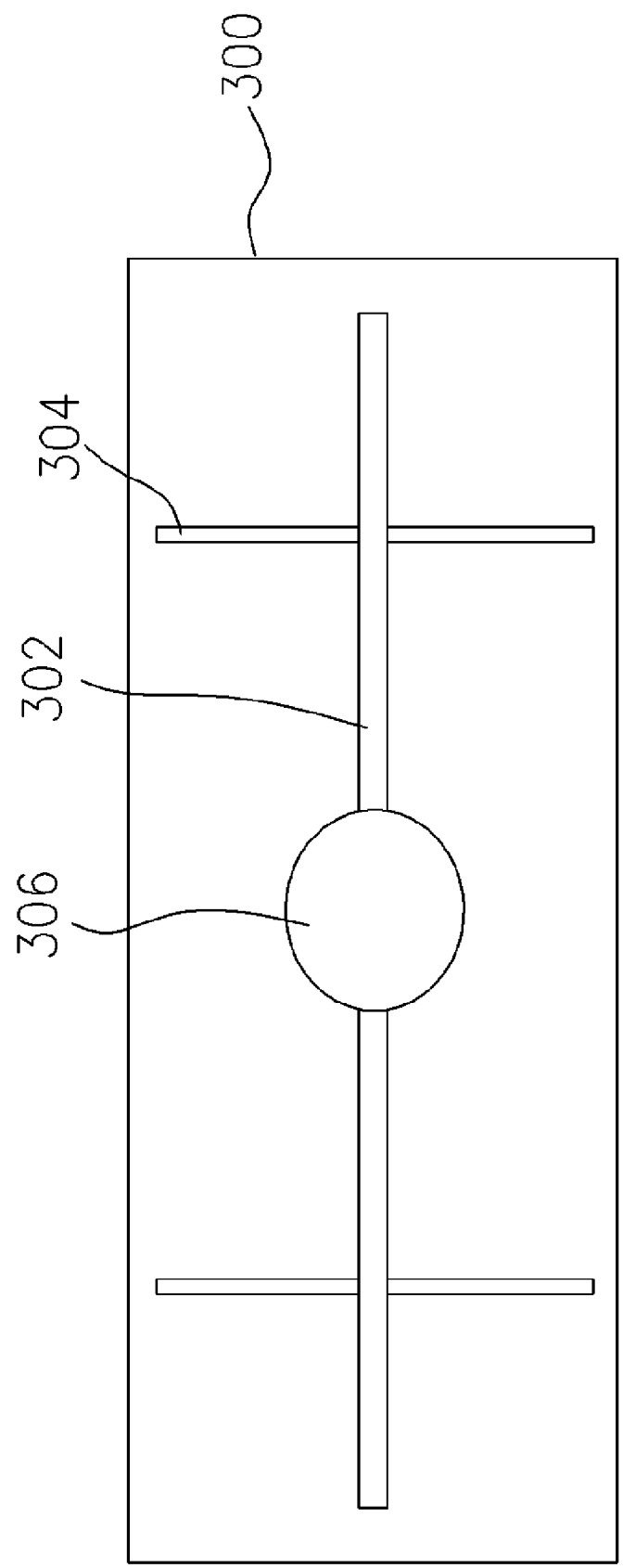

FIGS. 10A through 10C are top views showing the top mold, the packaging substrate and the bottom mold for molding semiconductor devices according to a fifth embodiment of the present invention. As shown in FIGS. 10A through 10C, the top mold 100 has a design identical to the third embodiment and the bottom mold 300 has a design identical to the fourth embodiment of the present invention. The principal variation is in the design of the packaging substrate 500. Aside from having openings 502, the packaging substrate 500 has an opening 506 located between the first cavity 112 in the top mold 100 and the second cavity 306 in the bottom mold 300. In other words, the opening 506 connects the first cavity 112 with the second cavity 306 during mold injection. Hence, molding material can flow from both the first cavity 112 and the second cavity 306 into the top runner 102 and the bottom runner 302 and then inject into the first dummy runners 104 and the second dummy runners 302 thereafter.

In the aforementioned third, fourth and fifth embodiments, openings 502, 504 or 506 can be selectively formed on the packaging substrate 500. All these designs facilitate the injection of molding material into the mold in the molding process. However, the inclusion or exclusion of openings such as 502, 504, 506 and the total number of openings used all depend on the actual requirement. In other words, reasonable changes in this part of the design are still within the scope of the present invention.

In summary, the mold for molding semiconductor devices and the molding method thereof have at least the following advantages:

1. Dummy runners are located in the top, bottom mold so that the degree of warping in the molding compound after cooling is significantly reduced.

2. Similarly, vertical ribs and horizontal ribs are fabricated on the second surface of the packaging substrate or stationing rings are set up on the backside of the packaging substrate to reduce warping after cooling.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A mold for encapsulating semiconductor devices mounted on a packaging substrate, the mold comprising:
   a top mold having a top runner, at least a first dummy runner connected to the top runner, a plurality of mold cavities and a plurality of second dummy cavities, wherein the mold cavities are connected to the top runner and located correspondingly to the semiconductor devices, and the second dummy mold cavities are connected to both ends of the top runner; and
   a bottom mold having at least a second dummy runner.

2. The mold of claim 1, wherein the first dummy runner extends into a space between the mold cavities.

3. The mold of claim 2, wherein the first dummy runner is located above but separated from the second dummy runner by the packaging substrate.

4. The mold of claim 2, wherein the first dummy runner extends in a direction perpendicular to the top runner.

5. The mold of claim 1, wherein the bottom mold further comprises a bottom runner connected to the second dummy runner.

6. The mold of claim 5, wherein the top runner is located above but separated from the bottom runner by the packaging substrate.

7. The mold of claim 5, wherein the second dummy runner extends in a direction perpendicular to the bottom runner.

8. The mold of claim 1, wherein each mold cavity has an identical dimension and the mold cavities are arranged as an array in die top mold.

9. The mold of claim 1, wherein each cavity has a volume at least to accommodate one of the semiconductor devices.

10. The mold of claim 1, wherein the top mold further comprises a plurality of first dummy mold cavities connected to the mold cavities.

11. The mold of claim 1, wherein the mold farther comprises a pot located within the top and the bottom mold such that the pot connects the top runner and the bottom runner.

12. The mold of claim 11, wherein the pot comprises a first cavity formed in die top mold and a second cavity formed in the bottom mold.

13. A method of encapsulating semiconductor devices, comprising the steps of:
   providing a packaging substrate having a first surface and a second surface, wherein the first surface of the packaging substrate has the semiconductor devices disposed thereon;
   placing the packaging substrate inside a mold; and
   injecting a molding material into the mold so that a plurality of molding compounds are formed on the first surface of the packaging substrate, wherein at least a first vertical rib and a first horizontal rib are formed on the first surface and at least a second vertical rib and a second horizontal rib are formed on the second surface simultaneously and aligned to the first vertical rib and die first horizontal rib in relation to the packaging substrate.

14. The method of claim 13, further comprising fanning at least a first vertical groove and a first horizontal groove on the first surface of the packaging substrate in locations corresponding to the first vertical rib and the first horizontal rib before placing the packaging substrate into the mold.

15. The method of claim 13, further comprising fanning at least a second vertical groove and a second horizontal groove on the second surface of the packaging substrate in locations corresponding to the second vertical rib and the second horizontal rib before placing the packaging substrate into the mold.

16. The method of claim 13, wherein the molding material is a transparent molding material.

17. The method of claim 13, wherein after the step of injecting a molding material into the mold is performed, the semiconductor devices are encapsulated in one of the molding compounds.

* * * * *